(12) United States Patent
Otte et al.

(10) Patent No.: US 8,969,978 B2
(45) Date of Patent: Mar. 3, 2015

(54) TMAP SENSOR SYSTEMS AND METHODS FOR MANUFACTURING THOSE

(71) Applicant: Melexis Technologies NV, Tessenderlo (BE)

(72) Inventors: Laurent Otte, Brussels (BE); Appolonius Jacobus Van Der Wiel, Duisburg (BE)

(73) Assignee: Melexis Technologies NV, Tessenderlo (BE)

( * ) Notice: Subject to any disclaimer, the term of this patent is extended or adjusted under 35 U.S.C. 154(b) by 0 days.

(21) Appl. No.: 13/870,209

(22) Filed: Apr. 25, 2013

(65) Prior Publication Data

US 2013/0285167 A1    Oct. 31, 2013

Related U.S. Application Data

(60) Provisional application No. 61/639,110, filed on Apr. 27, 2012.

(51) Int. Cl.
| | |
|---|---|
| H01L 29/84 | (2006.01) |
| B81B 3/00 | (2006.01) |
| B81C 1/00 | (2006.01) |
| G01L 19/00 | (2006.01) |
| G01L 19/04 | (2006.01) |
| G01L 19/14 | (2006.01) |

(52) U.S. Cl.
CPC ............ *H01L 29/84* (2013.01); *B81C 1/00158* (2013.01); *B81B 2201/0264* (2013.01); *G01L 19/0069* (2013.01); *G01L 19/04* (2013.01); *G01L 19/143* (2013.01)
USPC ............. 257/415; 257/48; 257/416; 257/417; 257/419; 257/E21.521; 257/E21.599; 257/E29.324; 257/E31.117

(58) Field of Classification Search
CPC ............ H01L 29/84; B81B 2201/0264; B81C 1/00158
USPC ............ 257/48, 415, 416, 417, 419, E21.521, 257/E21.599, E29.324, E31.117
See application file for complete search history.

(56) References Cited

U.S. PATENT DOCUMENTS

| | | | | |
|---|---|---|---|---|
| 8,146,439 | B2 * | 4/2012 | Ahles et al. ...................... | 73/754 |
| 2010/0055821 | A1 * | 3/2010 | Buhler et al. ................... | 438/51 |
| 2010/0300207 | A1 * | 12/2010 | Ding et al. ....................... | 73/721 |
| 2012/0012949 | A1 * | 1/2012 | Winkler et al. ................ | 257/415 |
| 2013/0277772 | A1 * | 10/2013 | Bryzek .......................... | 257/415 |

* cited by examiner

*Primary Examiner* — Dao H Nguyen
(74) *Attorney, Agent, or Firm* — Workman Nydegger

(57) ABSTRACT

A pressure sensor system comprising a pressure sensor chip is disclosed. The pressure sensor chip comprises a sensing side where pressure sensing is performed and one or more interconnections where electrical connections are made at the other side of the chip. The pressure sensor comprising an integrated circuit (1) forming a substrate, the substrate comprising a membrane shaped portion adapted for being exposed to the pressure, the integrated circuit (1) comprising both pressure signal sensing components and pressure signal processing components.

16 Claims, 1 Drawing Sheet

TMAP SENSOR SYSTEMS AND METHODS FOR MANUFACTURING THOSE

FIELD OF THE INVENTION

The invention relates to the field of sensors systems, methods of manufacturing those and methods of use of the parameters determined therewith.

BACKGROUND OF THE INVENTION

Sensor systems for use in industrial field like automotive, in particular for use within engines must be capable to operate in a reliable and robust way for a reasonable life time in harsh media conditions.

A plurality of pressure sensor systems is available on the market. One type of pressure sensors that currently is available are front side exposed pressure sensors. Such pressure sensors typically provide a pressure sensing area and a signal processing area, relying on a multi-chip solution. One example of such a front side exposed pressure sensor is described in US2010/0300207. Problems related to such a sensor include the fact that such sensors have a relative large footprint, often require a plurality of different manufacturing techniques for fabricating them and that interconnections for signal transport between the pressure sensing area and signal processing area are sensitive and need to be protected. This typically is done using a gel. With this approach the gel has to be able to protect the bond pads. A second protection layer for the bond pads is to cover them with noble metals as for instance gold. However so far no automotive pressure sensor supplier seems to have found a good solution using gels or gold over pad metallization capable to handle the harsher media of future engines. A non exhaustive list of typical applications where the pressure sensor faces a harsher media is the so called TMAP sensor (Temperature Manifold Air Pressure, Turbo Manifold Air Pressure), the EGR pressure sensor (Exhaust Gas Recirculation) and the DPF pressure sensor (Diesel Particulate Filter).

In the prior-art front side exposed pressure sensors are disclosed, the presence of the necessary protection gels for the chip interconnects (bond pads), furthermore induces a temperature barrier avoiding local in-situ (at the place where the pressure is determined) measuring of the temperature, thereby leading to inaccurate data and requiring feeding in of external temperature measurements. Further the capability of these solutions to cope with harsh media depends on the gel used and today no protective solutions are available for the harsh conditions of future engines.

One alternative to the gel and over pad metallization is to make a back side exposed absolute TMAP pressure sensor like illustrated in the FIG. 18 of US2010/0300207 A1. In the solution described, a 2 chip concept is used and the ICs are directly bonded to the TMAP sensor housing, via's are connected on the cap to contact the piezo resistors and the cap is connected to the silicon by a fusion bonding process. However no exploration of improving the temperature aspect for this kind of sensors is found.

It furthermore is a disadvantage that the 2 chip concept is made directly on module level and requires significant space as well as calibration costs.

U.S. Pat. No. 8,146,439 provides a monolithic solution based on the so called APSM (Advanced Pourous Silicon Membrane) process and where the IC is bonded to a substrate using a chip on board approach. There is still a need for a compact solution, providing accurate protection of components and wherein accurate temperature calibration is possible.

SUMMARY OF THE INVENTION

It is an object of the invention to provide low cost producing sensor systems for pressure sensing. It is an advantage of at least some embodiments of the present invention that pressure sensing systems are provided for example for applications where the pressure sensor faces a harsh medium, pressure sensing systems are provided wherein the temperature of the media is a useful complementary information for the system, in particular for example for so-called temperature manifold pressure sensing, even more in particular for temperature manifold absolute pressure sensing.

It is an advantage of embodiments of the present invention that the device results in a reduced assembly cost, as only one die is to be assembled.

It is an advantage of embodiments of the present invention that an improved component robustness for EMC is obtained compared to a two-chip solution, as with two chip solutions the electrical connections between the sensing element and the signal conditioning IC can pick up noise. The latter is no longer the case with an integrated IC.

It is an advantage of embodiments according to the present invention that an improved, e.g. faster chip temperature readout is obtained as the temperature sensor signal conditioning is located next to the temperature sensor on the same IC and by being back side exposed the gel no longer acts as a thermal barrier for a fast on chip temperature readout.

It is an advantage of embodiments according to the present invention that there is a potential to reduce component and module size as a single chip solution requires less space.

It is an advantage of embodiments of the present invention that it is possible to over-mold the external components such as resistors, capacitors, inductors used to protect the ICs against external electromagnetic disturbances.

It is an advantage of embodiments according to the present invention that a film assisted plastic transfer molding process to mold the component plastic housing can be used, as this allows to work with a sufficiently low stress on the external components (such as resistors, capacitors, inductors) so their integration on component level becomes possible. The latter forms e.g. more a problem when using a plastic injection molding process.

In contrast to prior art, e.g. in contrast to US2010/0300207, the ICs are not directly mounted in the macro module. This has the advantage that there are lower calibration costs as not the complete module is to be set on temperature and pressure to perform the sensor calibration. With a calibration at component level the mass that one has to heat is smaller and thus calibrating goes faster.

This also has the advantage that there is less stress on the IC as the IC does not feel all the mounting stress of the module in the engine. By using the ICs first in a component the component can buffer some of the mounting stress of the module in the engine.

This also has the advantage that the design of the component is independent of the electrical and pressure port connection requirements for each engine. This allows standardizing on a single design independent of the engine.

Mounting the external components (capacitors, resistors, inductors) on component level instead of in the macro module allows having them much closer to the IC reducing the effect of external electromagnetic disturbances.

It is an advantage of embodiments of the present invention that devices can be made that are low in manufacturing cost, require only a small number of different components or chips, and are integrated at the lowest possible level in an easy way.

In some inventive aspects the present invention may be accomplished by a method and device according to the present invention.

The invention provides a pressure sensor system, comprising a pressure sensor chip, being exposed to the medium (for instance air), of which the pressure needs to be determined, on a sensing side of the pressure sensor chip, while one or more interconnections such as electrical connections are located on the other side of said pressure sensor chip, such arrangement typically being called backside exposure. Typically such interconnects may be protected by a protection means like a gel. The pressure sensor chip may for instance be based on piezo resistance elements such as piezo resistors, for instance configured as a Wheatstone bridge. The pressure sensor comprises an integrated circuit forming a substrate, the substrate comprising a membrane shaped portion adapted for being exposed to the pressure, the integrated circuit comprising both pressure signal sensing components and pressure signal processing components. Where reference is made to the integrated circuit forming the substrate, reference may be made to the integrated circuit being fully embedded in the substrate or the integrated circuit being integrated in the circuit. The substrate is directly mounted on a component lead_frame of the pressure sensor.

It is an advantage of embodiments of the present invention that signal sensing and signal processing can be performed in the same integrated circuit.

In a further embodiment the pressure sensor system is selected to be a single chip solution.

The integrated circuit may be a silicon integrated circuit. It is an advantage of embodiments of the present invention that use can be made of well known production techniques.

The pressure signal processing components may comprise CMOS circuitry integrated on the integrated circuit. It is an advantage of embodiments of the present invention that use can be made of production techniques that are easily combinable with production techniques already used for processing the pressure sensor system.

The pressure sensor system furthermore may comprise a lead_frame, wherein electrical connection is provided from the integrated circuit to the lead_frame. Electrical connection between the integrated circuit and the lead_frame may comprise standard wire bonding or through semiconductor vias (TSV) in the substrate. In some embodiments such through semiconductor vias may be through silicon vias in the substrate. It is an advantage of embodiments of the present invention that electrical connections can be provided that are less vulnerable and require less protective materials.

The lead_frame may be adapted for directly connecting to an output electrical connector of the pressure sensor system, thus providing a printed circuit board (PCB) less solution. It is an advantage of embodiments of the present invention that systems can be provided wherein no PCB is required.

The pressure sensor system furthermore may comprise a cap for creating a zero bar reference for obtaining an absolute pressure sensor readout and for protecting the membrane, the cap being connected to the integrated circuit via a metal or glass frit interconnection layer. It is an advantage of embodiments of the present invention that a protection for the membrane can be provided that can be easily connected with other components in the system.

In a further embodiment the pressure sensor system is adapted for measuring an absolute pressure, for instance by providing the cap.

The substrate furthermore may comprise temperature sensing circuitry for measuring a temperature. It is an advantage of embodiments of the present invention that both pressure and temperature can be measured, thus providing useful complementary information of the system. It is an advantage of embodiments of the present invention that accurate measurements can be obtained due to the fast reaction time of the sensing circuitries caused by the absence of protection means at the sensing side.

The pressure signal sensing components and the temperature sensing circuitry may be both at least partly embedded in the membrane shaped portion. It is an advantage of embodiments of the present invention that temperature sensing can be performed close to the position where pressure is sensed, thus rendering accurate temperature information. It is an advantage of embodiments of the present invention that local temperature data can be used for analysis.

In one embodiment, the invention thus further provides the above pressure sensor system, wherein providing a means for performing a temperature measurement, on this one side (medium side), may be using the same pressure sensor chip as this means. In an embodiment thereon the temperature sensor is located on the membrane itself.

In one embodiment, the invention may be based on so-called temperature manifold pressure sensors, in particular temperature manifold absolute pressure sensors.

The pressure sensor chip furthermore may comprise data processing circuitry for providing a data output of both the pressure signal sensing components and the temperature sensing circuitry. It is an advantage of at least some embodiments of the present invention that correction of temperature influence of the pressure data can be performed on the pressure sensor chip without the need for importing temperature data, as local collection of temperature data can be performed.

In one embodiment, the invention hence further provides for a combined temperature-pressure sensor system, more in particular providing data read-out capabilities for both parameters.

The data processing circuitry may be adapted for providing a single data output by multiplexing data of the pressure signal sensing components and the temperature sensing circuitry. It is an advantage of at least some embodiments of the present invention that the amount of data channels required for outputting data can be limited. The invention, in certain embodiments, therefore also provides also a data protocol (appropriate headers and data frames) to be used in machinery using such sensors for distinguishing the relevant data portions.

The pressure signal sensing components and the temperature sensing circuitry may be part of the same integrated circuit.

The system furthermore may comprise at least one external electrical component being mounted on the lead_frame, wherein the at least one external electrical component is at least partly covered by a molding material. It is an advantage of embodiments of the present invention that external electrical components can be placed directly on the component lead frames. The latter allows them to be introduced much closer to the integrated circuit, reducing the effect of external electromagnetic disturbances. In an embodiment thereof the lead_frame is for a substantial part "protected" by the mold compound.

The at least one external electrical component may be any of a capacitor, a resistor or an inductor.

The at least one external electrical component and/or the lead frame may be fully covered by a molding material.

In an embodiment, the system is based on a substrate (for instance made in plastic) with both the pressure sensor and possible other components being mounted thereon on a first side while the inlet for the medium starting on the other side and extending through the substrate. The substrate and possible other components being partial covered by a mould compound, this mould compound defining a trench, wherein the pressure sensor fits. The interconnects of the pressure sensor are then protected by a protection means like a silicon gel, also fitting with this trench.

In an embodiment of the invention only the mold compound and the back side of the silicon chip are in contact with the harsh media. In a further embodiment also the die attach material is in contact therewith.

In some embodiments, the pressure sensor system may be adapted for integration in a housing, such housing also providing for an inlet of the medium. The housing may be adapted for having a sealing (on the other side from the inlet). The pressure sensor system may be integrated or integratable in the housing such that the front side of the chip (with the interconnects) is on the side of the sealing, while the part exposed to the medium being located on the side of the housing inlet.

In one aspect, the present invention also relates to a pressure sensor system, the system comprising a pressure sensor chip adapted for being exposed to the medium of which the pressure is to be determined on a sensing side of the pressure sensor chip and the pressure sensor chip comprising at least one interconnection where electrical connections are made at the other side of the chip, the pressure sensor chip comprising a substrate comprising a membrane shaped portion adapted for being exposed to the pressure, the substrate comprising at the sensing side of the pressure sensor chip a pressure sensing circuitry for measuring a pressure and temperature sensing circuitry for measuring a temperature. Other optional features may correspond with one or more standard or optional features described for the pressure sensor system of the first aspect.

In still another aspect, the present invention relates to a pressure sensor system, the system comprising a pressure sensor chip adapted for being exposed to the medium of which the pressure is to be determined on a sensing side of the pressure sensor chip and the pressure sensor chip comprising at least one interconnections where electrical connections are made at the other side of the chip, the pressure sensor chip comprising a substrate comprising a membrane shaped portion adapted for being exposed to the pressure, a lead_frame for mounting the substrate thereon and connecting the substrate thereto, and at least one external electrical component being mounted on the lead_frame, wherein the at least one external electrical component is at least partly covered by a molding material. Other optional features may correspond with one or more standard or optional features described for the pressure sensor system of the first aspect.

Features from embodiments may be combined with features of other embodiments and with features of other examples as appropriate.

These and other aspects of the invention will be apparent from and elucidated with reference to the embodiment(s) described hereinafter.

Figure 1:
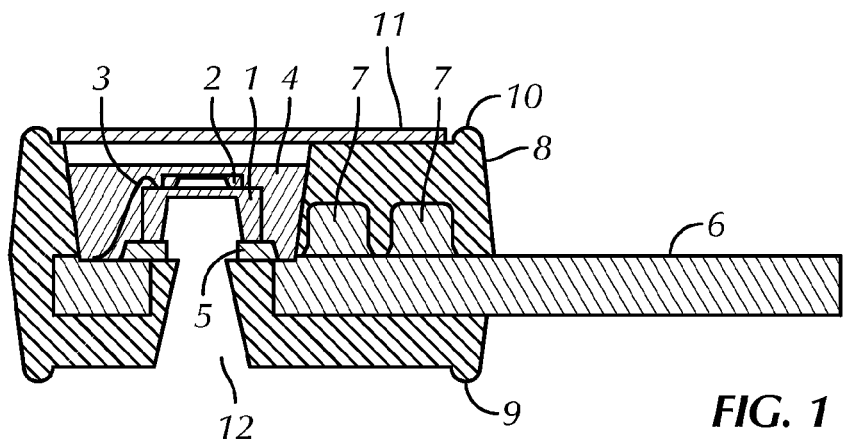
FIG. 1 shows a component according to an embodiment of the present invention.

The drawings are only schematic and are non-limiting. In the drawings, the size of some of the elements may be exaggerated and not drawn on scale for illustrative purposes.

Any reference signs in the claims shall not be construed as limiting the scope.

In the different drawings, the same reference signs refer to the same or analogous elements.

DETAILED DESCRIPTION OF ILLUSTRATIVE EMBODIMENTS

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the invention.

Furthermore, the terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the invention described herein are capable of operation in other sequences than described or illustrated herein.

Moreover, the terms top, under and the like in the description and the claims are used for descriptive purposes and not necessarily for describing relative positions. It is to be understood that the terms so used are interchangeable under appropriate circumstances and that the embodiments of the invention described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

In the description provided herein, numerous specific details are set forth. However, it is understood that embodiments of the invention may be practiced without these specific details. In other instances, well-known methods, structures and techniques have not been shown in detail in order not to obscure an understanding of this description.

Where in embodiments according to the present invention reference is made to a module, reference may for example be made to a macro element that will be directly assembled in the engine of a car.

Where in embodiments according to the present invention reference is made to a component, reference may be made to the semiconductor device assembled in a housing usually made of plastic (much smaller size compared to a module) that is installed in the module.

In a first aspect, the present invention relates to a pressure sensor system comprising a pressure sensor chip is disclosed. The present invention also is related to the pressure sensor chip as such. The pressure sensor system according to embodiments of the present invention can be used in a plurality of industrial fields, such as the automotive sector.

According to embodiments of the present invention, the pressure sensor chip comprises a sensing side where pressure sensing is performed and one or more interconnections where electrical connections are made at the other side of the chip. In other words, a backside exposed pressure sensor system is envisaged. The pressure sensor comprises an integrated circuit forming a substrate, the substrate comprising a membrane shaped portion adapted for being exposed to the pressure. According to embodiments, the integrated circuit comprises both pressure signal sensing components and pressure signal processing components. According to embodiments of the present invention, the substrate may be directly mounted on a component lead_frame of the pressure sensor. Embodiments of the present invention provide for a sensor solution with harsh media capability. Advantageously, pressure system embodiments are provided that result in a PCB less solution. In some embodiments, as will be described further, external component integration (capacitors, resistors, inductors) on component level is obtained. In some embodiments, as will be described further, compensated external temperature information multiplexed with pressure information on a single line is obtained. This may for example be performed using the protocol SENT as known by the person skilled in the art(per SAE J-2716 spec rev Jan 2010). Embodiments also may provide on chip temperature measurement instead of external temperature sensor.

By way of illustration, embodiments according to the present invention not being limited thereby, a particular example of an embodiment of the present invention is described in FIG. 1. It demonstrates the main silicon integrated circuit 1, which may be used as substrate, with an etched membrane in the center and wherein CMOS circuitry can be processed on the same IC. To the main integrated circuit, typically a silicon IC, the wafer cap 2 can be soldered by a glass frit or metal interconnection layer. Electrical wire bondings 3 may be connecting the IC bond pads to the component lead_frame. A silicon gel may be applied to protect the IC and the wires from dust during the manufacturing steps.

Figure 3:
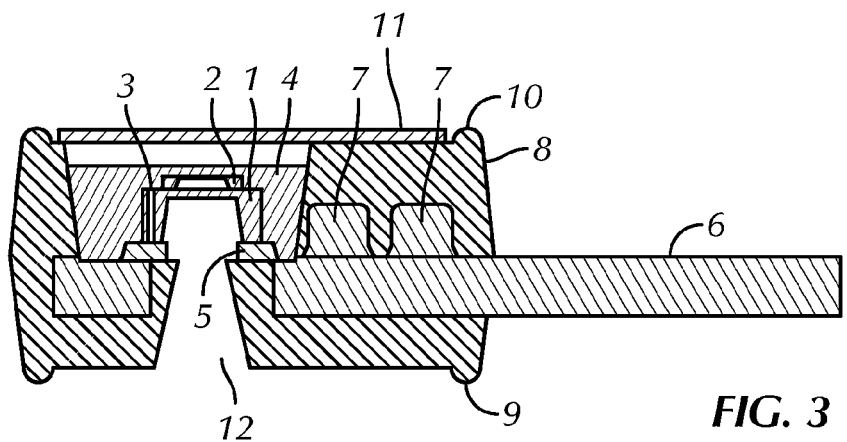
FIG. 3 shows a component according to an embodiment of the present invention, wherein through semiconductor vias are provided.

It is to be noticed that connection of the integrated circuit with a lead_frame may make use of through semiconductor vias, e.g. through silicon vias, instead of using wire connections that typically need to be encapsulated, this is illustrated by 3 on FIG. 3. Manufacturing techniques for producing through semiconductor vias are known to the person skilled in the art.

Furthermore, die attach material 5 can be used to glue the main silicon IC to the component substrate. The lead frame 6 of the component with the electrical signals can be welded/soldered directly on the electrical connector of the module (PCB less solution). External components (such as for example capacitors, resistors, inductors) 7 can be placed directly on the component lead frame and overmolded by the plastic material of the component. The plastic material 8 of the component that may be present, is also shown. Ridge 9 can be used at the back side edge of the component to facilitate the use of a wet sealing process by the module manufacturer. In the module there may be a groove mating the ridge, in the groove some glue can be dispensed and the back side of the component can be sealed from the front side thanks to the wet sealing on the ridge. The complete component with it's ridges can be molded at the same molding step. Ridge 10 can be used on the top side edge of the component to facilitate the alignment and placement of an optional protective cover 11. Such an optional protective cover 11 may be used to make the component handling easier (no open cavity with exposed silicon, gel and wires anymore). A pressure port connection 12 to the application where the sensor can measure the pressure of a harsh media air and also measure the temperature of that media is also shown.

FIG. 1 thus demonstrates a back side exposed absolute integrated solution, assembled in a plastic leadframe package with integrated external components. This solution in the market combines one or more of the following aspects:
  single chip component
  back side exposed absolute pressure sensor for harsh media
  PCB less solution with external components integrated and overmolded thanks to the use of transfer molding
  Protection from harsh media becomes gel independent
  No thermal barrier from the gel anymore so there is a possibility to measure the temperature from the air in the intake directly on chip.

In one embodiment, the present invention thus provides a pressure sensor system, wherein a temperature measurement is performed on chip. The substrate then comprises at the sensing side of the pressure sensor chip temperature sensing circuitry for measuring a temperature. Such temperature sensing circuitry may comprise thermistors or thermocouples on the membrane or a band gap circuit . . . . The pressure signal sensing components and the temperature sensing circuitry can be both at least partly embedded in the membrane shaped portion. The pressure sensor chip furthermore_may comprises data processing circuitry for providing a data output of both the pressure signal sensing components and the temperature sensing circuitry. Such circuitry may be integrated in the same integrated circuit as the components for pressure signal sensing. The data processing circuitry may be adapted for providing a single data output by multiplexing data of the pressure signal sensing components and the temperature sensing circuitry. The circuitry (in integrated form or separate) may be provided in any suitable software or hardware form.

The providing of the above combined temperature-pressure sensor system, in particular the lack of protection means like gel between the medium and the pressure and on chip temperature sensor (as would be the case in front side exposed based approaches), leads to a fast reaction time of the temperature sensor, and hence accurate (say almost instant correct) temperature for the measured medium, and hence instead of using external reference temperature information to derive the right temperature value, this locally sensed temperature can be used. The above sensor therefore does not longer require temperature reference information going in, on the contrary the system preferably provides for combined read-out of pressure and temperature info as described above for further processing.

According to one aspect, the present invention therefore also relates to a method for determining pressure of a medium, based on the response of a pressure sensitive element, whereby the temperature influence can be corrected by use of the temperature of the medium, determined nearby the pressure sensitive element, for instance on the sensor membrane itself.

The component according to embodiments of the present invention can be made, using the following exemplary processing method, embodiments of the present invention not being limited thereto. The IC can be made using the following steps.

CMOS processing in small feature technologies in for instance 8" wafer size can be used for defining the electronic circuitry. Alternatively also other semiconductor processing could be used. After the CMOS process, the membranes are created, e.g. using a chemical wet etching process. The wafer cap is created with a similar chemical wet process and soldered with a metallic interconnection or glass frit to the main substrate, e.g. the CMOS silicon wafer. The cap is then opened at the sides to give access to the bond pads for the electrical wire connections.

The component plastic housing is made by the following steps: placement of the external components (capacitors, resistors, inductors) on the lead frame. Overmolding of the lead frame and external components may be performed with a film assisted molding technique leaving an open cavity for further placement of the silicon IC. The silicon IC is bonded to the component plastic housing, bonding wires or TSVs connect electrically the IC and gel is dispensed in the cavity to cover the IC and it's bonding wires. The components can then be electrically tested under pressure and temperature to perform the calibration of the pressure sensor.

A calibrated pressure sensor component is delivered to the module manufacturer. The module manufacturer fixes the component in the module (e.g. gluing it to make a wet sealing in their housing for instance or by pressing the part against a rubber based gasket to seal the application pressure to the component) and weld the leads of the component directly in their electrical connector (PCB less solution). The idea is to create a nest in the customer module and to fix the component in the customer housing for welding the leads directly on their lead frame. The module manufacturer can then dispense extra gel on the welding points to offer an extra level of protection to that electrical connection point.

Figure 2:
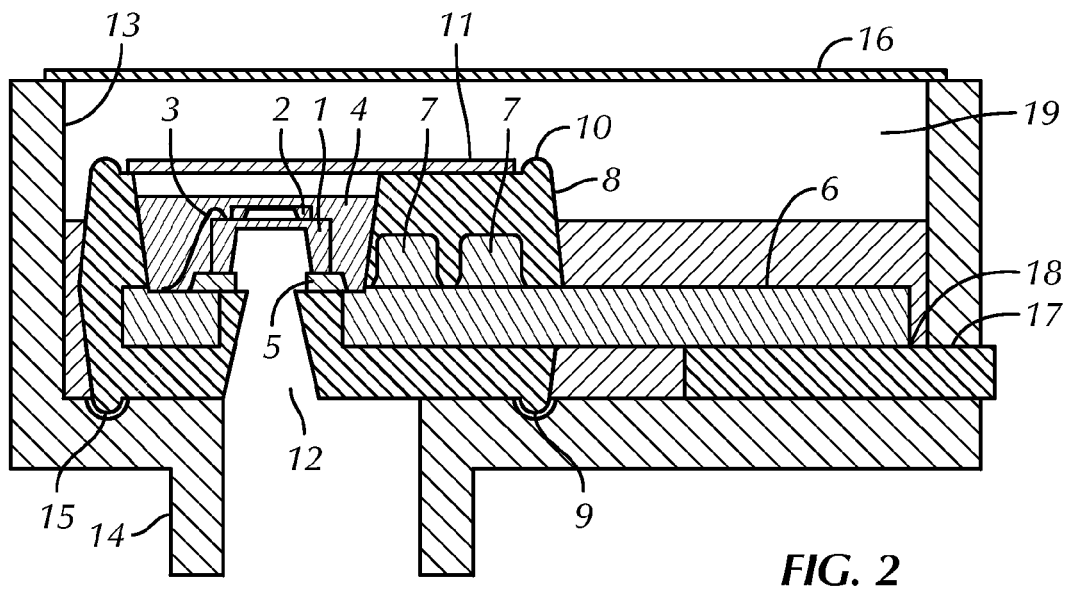
FIG. 2 shows the component integration in a suitable_module housing, for instance a TMAP module according to an embodiment of the present invention.

The FIG. 2 illustrates how the product can be integrated in the module housing. It shows the module plastic housing 13, the module pressure port 14 directly connected and sealed in the application, e.g. an engine. Groove 15 is foreseen in the module housing to have glue dispensed in it and to make a sealing on the ridge surface of the component to isolate the back side from the front side. Alternatively, the ridge 9 can be used to increase the compression of a rubber based gasket placed in a groove in the module to seal the pressure. The cover 16 on the module plastic housing may be used to make the module handling easier so there are no exposed electrical welding points in the application. Furthermore, electrical pins 17 may be present in the plastic module whereon welding or soldering points 18 of the component on the pins of the plastic module can be present. Furthermore, a protective coating or gel 19 for the module, the component lead frame and the welding/soldering points may be present.

The invention claimed is:

1. A pressure sensor system comprising:
 a pressure sensor chip adapted for being exposed to the medium of which the pressure is to be determined on a sensing side of the pressure sensor chip and the pressure sensor chip comprising one or more interconnections where electrical connections are made at the other side of the chip,
 the sensor system being a backside exposed sensor system, and
 the pressure sensor comprising an integrated circuit forming a substrate, the substrate comprising a membrane shaped portion adapted for being exposed to the pressure, the integrated circuit comprising both pressure signal sensing components and pressure signal processing components, and the substrate being directly mounted on a component lead frame of the pressure sensor system.

2. A pressure sensor system according to claim 1, wherein the integrated circuit is a silicon integrated circuit.

3. A pressure sensor system according to claim 1, wherein the pressure signal processing components comprise CMOS circuitry integrated on the integrated circuit.

4. A pressure sensor system according to claim 1, the pressure sensor system furthermore comprising a lead frame, wherein electrical connection is provided from the integrated circuit to the lead frame.

5. A pressure sensor system according to claim 4, wherein electrical connection between the integrated circuit and the lead frame comprises through semiconductor vias (TSV) in the substrate.

6. A pressure sensor system according to claim 4, wherein the lead frame is adapted for directly connecting to an output electrical connector of the pressure sensor system, thus providing a printed circuit board less solution.

7. A pressure sensor system according to claim 4, the system furthermore comprising at least one external electrical component being mounted on the lead frame, wherein the at least one external electrical component is at least partly covered by a molding material.

8. A pressure sensor system according to claim 7, wherein the at least one external electrical component is any of a capacitor, a resistor or an inductor.

9. A pressure sensor system according to claim 7, wherein the at least one external electrical component and/or the lead frame is fully covered by a molding material.

10. A pressure sensor system according to claim 1, the pressure sensor system furthermore comprising a cap for protecting the membrane, the cap being connected to the integrated circuit.

11. A pressure sensor system according to claim 1, wherein the substrate furthermore comprises at the sensing side of the pressure sensor chip temperature sensing circuitry for measuring a temperature.

12. A pressure sensor system according to claim 11, wherein the pressure signal sensing components and the temperature sensing circuitry are both at least partly embedded in the membrane shaped portion.

13. A pressure sensor system according to claim 11, wherein the pressure sensor chip furthermore comprises data processing circuitry for providing a data output of both the pressure signal sensing components and the temperature sensing circuitry.

14. A pressure sensor system according to claim 13, wherein the data processing circuitry is adapted for providing a single data output by multiplexing data of the pressure signal sensing components and the temperature sensing circuitry.

15. A pressure sensor system according to claim 11, wherein the pressure signal sensing components and the temperature sensing circuitry are part of the same integrated circuit.

16. A pressure sensor system according to claim 1, wherein the pressure sensor chip is electrically connected to the component lead frame by the electrical connections, the electrical connections being formed on the other side of the chip.

\* \* \* \* \*